US008036446B2

(12) United States Patent
Ikenaga et al.

(10) Patent No.: US 8,036,446 B2
(45) Date of Patent: Oct. 11, 2011

(54) SEMICONDUCTOR MASK INSPECTION USING DIE-TO-DIE AND DIE-TO-DATABASE COMPARISONS

(75) Inventors: Osamu Ikenaga, Yokohama (JP); Tomohiro Tsutsui, Kawasaki (JP)

(73) Assignee: Kabushiki Kaisha Toshiba, Tokyo (JP)

(*) Notice: Subject to any disclaimer, the term of this patent is extended or adjusted under 35 U.S.C. 154(b) by 949 days.

(21) Appl. No.: 11/439,989

(22) Filed: May 25, 2006

(65) Prior Publication Data
US 2006/0270072 A1 Nov. 30, 2006

(30) Foreign Application Priority Data

May 25, 2005 (JP) .................................. 2005-152435

(51) Int. Cl.
*G06K 9/00* (2006.01)
(52) U.S. Cl. .......................................... 382/144; 438/16
(58) Field of Classification Search .................. 382/144, 382/145, 149; 356/237.2, 237.5; 438/14, 438/16
See application file for complete search history.

(56) References Cited

U.S. PATENT DOCUMENTS

| 5,725,974 | A  | * | 3/1998  | Kawahira ........................ 430/5 |
| 6,529,621 | B1 | * | 3/2003  | Glasser et al. ................. 382/144 |
| 7,027,635 | B1 | * | 4/2006  | Wihl et al. .................... 382/144 |
| 7,421,109 | B2 | * | 9/2008  | Tsuchiya et al. .............. 382/144 |
| 7,664,310 | B2 | * | 2/2010  | Emery .......................... 382/145 |
| 2004/0052411 | A1 | * | 3/2004 | Qian et al. .................... 382/144 |
| 2004/0133369 | A1 | * | 7/2004 | Pack et al. .................... 702/59 |
| 2005/0003280 | A1 | * | 1/2005 | Tsutsui et al. ................. 430/5 |

FOREIGN PATENT DOCUMENTS

| JP | 3-13945     | 1/1991  |
| JP | 6-265480    | 9/1994  |
| JP | 8-272078    | 10/1996 |
| JP | 2002-23345  | 1/2002  |
| JP | 2002-244275 | 8/2002  |
| JP | 2005-49611  | 2/2005  |

OTHER PUBLICATIONS

Foll, H. (Apr. 2005) "Lithography: Basic Lithography Techniques." http://www.tf.uni-kiel.de/matwis/amat/elmat_en/kap_6/backbone/r6_6_1.html as archived by The Internet Archive, http://www.archive.org/.* Tsutsui, et al., "Method of Creating Photo Mask Data, Method of Photo Mask Manufacturing, and Method of Manufacturing Semiconductor Device", U.S. Appl. No. 11/187,003, filed Jul. 22, 2005.
Notice of Reasons for Rejection mailed by the Japanese Patent Office on Sep. 28, 2010, in Japanese patent application No. 2005-152435.

* cited by examiner

*Primary Examiner* — Bhavesh Mehta
*Assistant Examiner* — Barry Drennan
(74) *Attorney, Agent, or Firm* — Finnegan, Henderson, Farabow, Garrett & Dunner, L.L.P.

(57) ABSTRACT

A mask forming method includes preparing design data of mask including pattern regions having identical repetition patterns respectively, generating mask pattern data of mask based on the design data, generating inspection control information for controlling inspection of defect on mask based on the mask pattern data, the information including positional information of the pattern regions and inspection sensitivity information of the repetition pattern, providing the inspection control information to mask pattern data, forming mask pattern of mask based on the mask pattern data, and inspecting the mask pattern based on the mask pattern data comprising inspecting portion in the mask pattern different from the pattern regions by Die-to-Database comparison method, the inspecting the portion including selecting portion corresponding to repetition pattern from the mask pattern based on the positional information, and inspecting the selected portion by Die-to-Die comparison method at an inspection sensitivity corresponding to inspection sensitivity information.

20 Claims, 3 Drawing Sheets

(12) United States Patent US 8,036,446 B2

SEMICONDUCTOR MASK INSPECTION USING DIE-TO-DIE AND DIE-TO-DATABASE COMPARISONS

CROSS-REFERENCE TO RELATED APPLICATIONS

This application is based upon and claims the benefit of priority from prior Japanese Patent Application No. 2005-152435, filed May 25, 2005, the entire contents of which are incorporated herein by reference.

BACKGROUND OF THE INVENTION

1. Field of the Invention

The present invention relates to a mask forming method and a semiconductor device manufacturing method used in lithography process of semiconductor process.

2. Description of the Related Art

In recent years, the downsizing of semiconductor devices has been in progress. As a result, in a mask manufacturing process, a correction process for correcting an optical proximity effect (OPC: Optical Proximity Correction) has been carried out. By the OPC process, fine graphics such as fine pattern steps or fine pattern irregularities are formed on design data.

Mask pattern data at the time of forming a mask pattern (data obtained by applying a required process such as an OPC process for design data) includes data that corresponds to fine graphics.

However, fine graphics are not always reflected faithfully on a pattern (mask pattern) actually formed on a mask. Therefore, the degree of faithfulness of a mask pattern relevant to mask pattern data (degree of pattern forming faithfulness) is lowered at a portion of the mask pattern that corresponds to the fine graphics.

In recent years, a mask pattern has been inspected at a high sensitivity of defect detection. Thus, there has been established a situation in which the lowered degree of pattern forming faithfulness cannot be ignored in guaranteeing an inspection result.

For example, in a mask defect inspection of Die-to-Database comparison method (Jpn. Pat. Appln. KOKAI Publication No. 2002-23345), the following problem occurs due to the lowered degree of pattern forming faithfulness.

In the mask defect inspection of the Die-to-Database method, the presence or absence of a defect in a mask pattern is checked with a desired sensitivity of defect detection by comparing the mask pattern and mask pattern data with each other.

Here, in the case where, due to the lowered degree of pattern forming faithfulness, a difference between the mask pattern and the mask pattern data exceeds a critical condition (thresholds indicating whether or not a defect is observed) for the severest defect detection sensitivity (corresponding to a detected minimum defect size) at a portion of the fine graphics formed by OPC process, the portion of the fine graphics formed by OPC process is recognized as a defect.

The above described defect is a harmless defect from the viewpoint of device guaranteeing (hereinafter, referred to as a false defect). There is no need for correcting the false defect. For this reason, a work of classifying a plurality of detected defects into false defect and true defect (harmful defect from the viewpoint of device guaranteeing) is carried out.

In this classifying work, a workload increases due to a trend for downsizing semiconductor devices. Part of the classifying work is automated. However, the automated classifying work is still poor in reliability. Therefore, there has not been established a situation in which a classifying work by visual inspection can be eliminated.

Under such a situation as described above, a tremendous number of false defects occur in one mask due to the downsizing of a pattern and due to the downsizing of an OPC correction grid (correction unit). Specifically, false defects may occur in number exceeding an upper limit of defects in number that can be maintained (stored) in a defect inspection apparatus. In this case, there has been established a situation in which the whole mask cannot be inspected.

An inspection capable of reducing the number of detected false defects includes a mask defect inspection by Die-to-Die comparison method. This inspection selectively extracts regions formed by the same pattern group from the all of patterns formed on one mask, and comparatively checking detection signals between the extracted regions, thereby detecting a defect.

However, in general, a pattern forming region of one mask is not formed of only the same pattern group, and all the defects in a desired region of the mask cannot always be detected by only the defect inspection of the Die-to-Die comparison method.

BRIEF SUMMARY OF THE INVENTION

According to an aspect of the present invention, there is provided a mask forming method comprising: preparing design data of a mask including a plurality of pattern regions, the plurality of pattern regions including identical repetition patterns, respectively; generating mask pattern data of the mask based on the design data; generating inspection control information for controlling inspection of a defect on the mask based on the mask pattern data, the inspection control information including positional information of the plurality of pattern regions and inspection sensitivity information of the repetition pattern; providing the inspection control information to the mask pattern data; forming a mask pattern of the mask based on the mask pattern data to which the inspection control information is provided; and inspecting the mask pattern based on the mask pattern data to which the inspection control information is provided comprising inspecting a portion in the mask pattern being different from the plurality of pattern regions by Die-to-Database comparison method, the inspecting the portion in the mask pattern being different from the plurality of pattern regions by Die-to-Database comparison method including selecting a portion corresponding to the repetition pattern in the plurality of pattern regions from the mask pattern based on the positional information of the plurality of pattern regions; and inspecting the selected portion by Die-to-Die comparison method at an inspection sensitivity corresponding to the inspection sensitivity information.

According to another aspect of the present invention, there is provided a semiconductor device manufacturing method comprising: applying a resist on a substrate including a semiconductor substrate; forming a resist pattern including diposing a mask by mask forming method, irradiating an optical beam or electric charge beam on the resist via the mask; and developing the resist, the mask forming method comprising preparing design data of a mask including a plurality of pattern regions, the plurality of pattern regions including identical repetition patterns, respectively; generating mask pattern data of the mask based on the design data; generating inspection control information for controlling inspection of a defect on the mask based on the mask pattern data, the inspection control information including positional information of the plurality of pattern regions and inspection sensitivity information of the repetition pattern; providing the inspection control information to the mask pattern data; forming a mask pattern of the mask based on the mask pattern data to which the inspection control information is provided; and inspecting the mask pattern based on the mask pattern data to which the inspection control information is provided comprising inspecting a portion in the mask pattern being different from the plurality of pattern regions by Die-to-Database comparison method, the inspecting the portion in the mask pattern being different from the plurality of pattern regions by Die-to-Database comparison method including selecting a portion corresponding to the repetition pattern in the plurality of pattern regions from the mask pattern based on the positional information of the plurality of pattern regions; and inspecting the selected portion by Die-to-Die comparison method at an inspection sensitivity corresponding to the inspection sensitivity information; and forming a pattern by etching the substrate using the resist pattern as a mask.

DETAILED DESCRIPTION OF THE INVENTION

Embodiments of the present invention will be described hereinafter with reference to the drawings.

Figure 1:
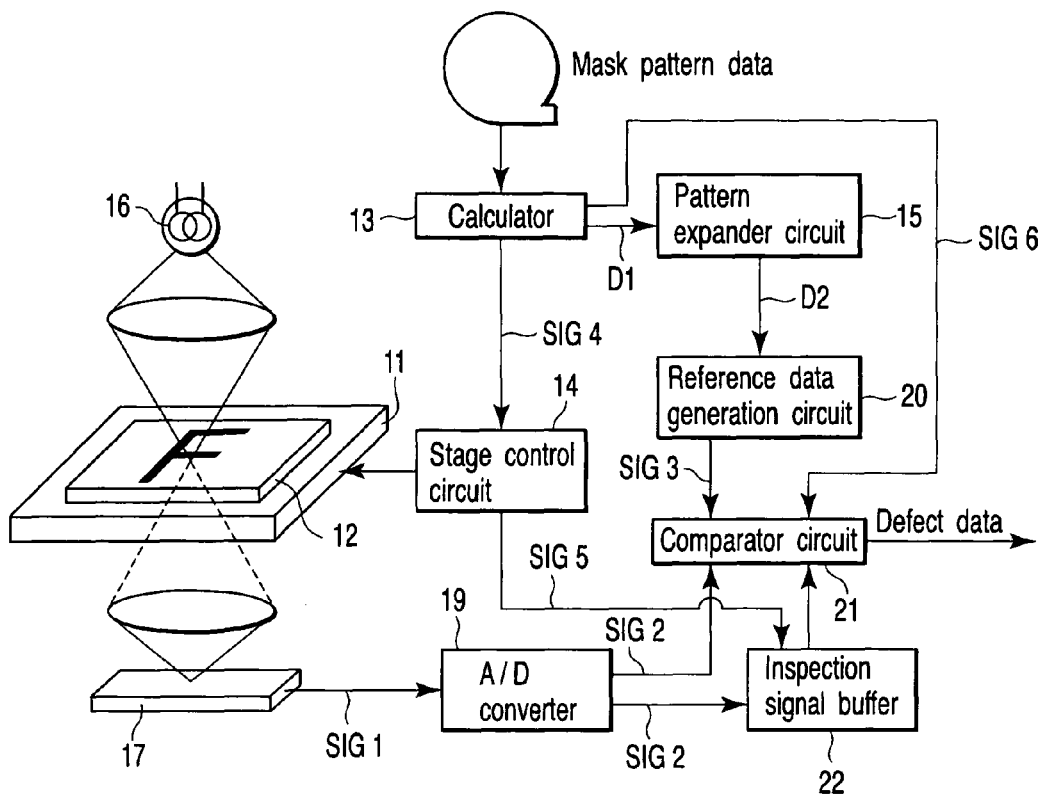
FIG. 1 is a block diagram depicting a schematic configuration of a mask defect inspection apparatus used in an embodiment of the present invention.

FIG. 1 is a block diagram depicting a schematic configuration of a mask defect inspection apparatus used in an embodiment of the present invention.

In the figure, reference numeral 11 designates an XY table. On the XY table, a mask 12 used in manufacturing a semiconductor device is placed. The XY table 11 is driven in an X direction (horizontal direction on the plane) and in a Y direction (vertical direction on the plane) a stage control circuit 14 having received a command from a calculator 13.

A position of the XY stage 11 is monitored by a laser interferometer (not shown). Positional information of the monitored XY stage 11 is inputted to the stage control circuit 14. The stage control circuit 14 controls the XY stage 11 having the mask 12 placed thereon with high precision on the basis of the inputted positional information.

On the other hand, a light source 16 is disposed above the XY stage 11. A light beam emitted from the light source 16 is irradiated on the mask 12 placed on the XY stage 11. The light beam having transmitted the mask 12 is formed as an image on a light receiving face of an image sensor 17 as represented by a CCD sensor. The image sensor 17 comprises, for example, a plurality of optical light receiving sensors allocated in one column.

While the top of the mask 12 is irradiated with the above described light beam, the XY stage 11 is continuously moved to a direction (Y direction) orthogonal to a scanning direction (X direction) of a sensor of the image sensor 17, thereby, a detection signal (detection analog signal) SIG1 corresponding to a mask pattern of the mask 12 is detected by the image sensor 17.

In accordance with the command from the calculator 13, the detection analog signal SIG1 is converted into a digital signal (detection digital signal) SIG2 by an AD converter 19. The detection digital signal SIG2 is sent out from the AD converter 19 to a comparator circuit 21. Further, the detection digital signal SIG2 is stored in an inspection signal buffer 22.

On the other hand, mask pattern data (pattern design data) that is a base for forming a mask pattern to be an inspection object is inputted to the calculator 13. Mask pattern data D1 is sent out from the calculator 13 to a pattern expander circuit 15.

The pattern expander circuit 15 expands the mask pattern data D1 to expanded data D2. The expanded data D2 is sent out from the pattern expander circuit 15 to a reference data generation circuit 20.

The reference data generation circuit 20 produces a reference digital signal SIG3 by converting the mask pattern data of the region which corresponds to the detection signal SIG1 detected by the image sensor 17 into a signal format that can be comparatively checked with the detection digital signal SIG2. The reference digital signal SIG3 is sent out from the reference data generation circuit 20 to the comparator circuit 21.

The comparator circuit 21 compares the detection digital signal SIG2 and the reference digital signal SIG3 with each other in accordance with a proper algorithm by the command from the calculator 13. In the case where no coincidence occurs, the comparator circuit 21 determines that pattern defect exists, and then, outputs defect data.

An inspection of the mask 12 is made by repeatedly carrying out a series of the defect inspection operations described above, namely, by repeatedly carrying out a scanning operation of the image sensor 17 and a continuous moving operation of the XY stage 11 having the mask 12 placed thereon, and then, comparatively checking the detection digital signal SIG2 and the reference digital signal SIG3 in a desired region on the mask 12.

The above description corresponds to a defect inspection which does not use the detection digital signal SG2 stored in the inspection signal buffer 22, namely, to a defect inspection of the Die-to-Database comparison method.

Next, a description will be given with respect to a defect inspection of a Die-to-Die comparison method using the mask defect inspection apparatus shown in FIG. 1. In the case of the Die-to-Die comparison method, the digital signal SIG2 stored in the inspection signal buffer 22 is utilized.

Figures 2A, 2B:
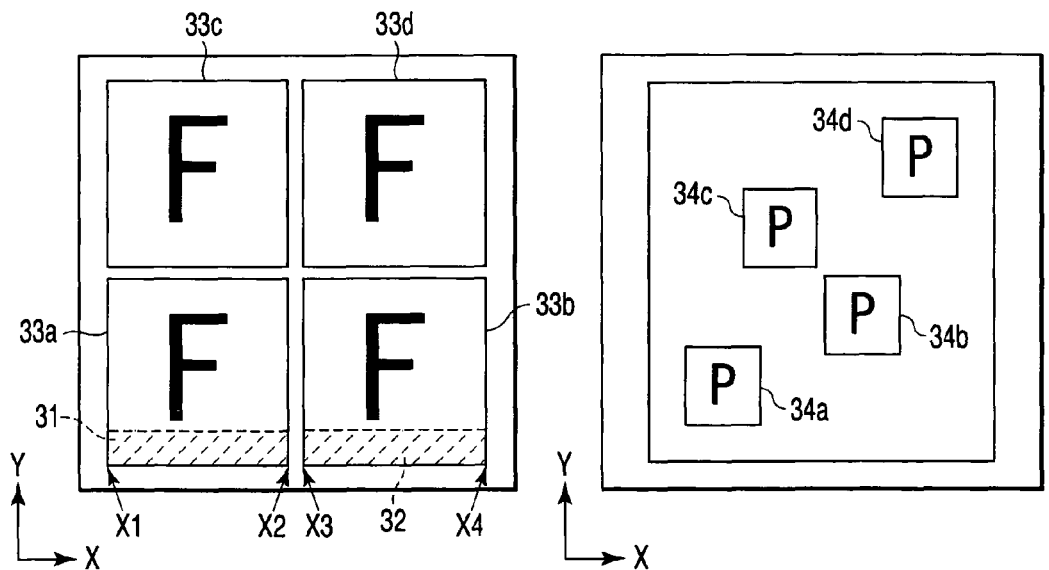
FIGS. 2A and 2B are plan views each showing a specific example of a plurality of pattern regions that include the same repetition patterns on a mask.

First, a description will be given with respect to a case in which a group of the same patterns shown in FIG. 2A is repeatedly allocated in an X direction on the mask 12.

In FIG. 2A, reference numerals 33a to 33d designate first to fourth pattern regions (a plurality of pattern regions) that are inspection regions. The first to fourth pattern regions 33a to 33d each include the same repetition patterns.

Reference inspection positions X1 and X2 and repetition positions X3 and X4 are stored in advance in the calculator 13.

In the same manner as the above described procedures, a group of optical light receiving sensors of the image sensor 17 is scanned in the Y direction (vertically direction on the plane) opposite to the movement direction of the XY stage 11, while the XY stage 11 having the mask 12 placed thereon is continuously moved in the X direction (horizontal direction on the plane). Consequently, a detection analog signal SIG1 (hereinafter, referred to as first detection analog signal SIG1) is obtained that corresponds to that of a partial region 31 of the first pattern region 33a formed on the mask 12. Further, the first detection analog signal SIG1 is converted into a digital signal SIG2 (hereinafter, referred to as first detection digital signal SIG2) by the AD converter 19.

The first detection digital signal SIG2 is sent out to the comparator circuit 21 and is stored in the inspection signal buffer 22.

At this time, a stage position acquisition signal SIG4 is sent out from the calculator 13 to the stage control circuit 14, and positional information on the XY stage 11 is acquired by the stage control circuit 14. A stage position signal SIG5 including the acquired positional information is sent out to the inspection signal buffer 22. As a result, in the inspection signal buffer 22, a first detection digital signal SIG2 is stored, the first digital signal corresponding to the partial region 31 from the reference inspection position X1 to the reference inspection position X2.

Next, a detection analog signal SIG1 (hereinafter, referred to as second detection analog signal SIG1) is produced, the analog signal corresponding to a partial region 32 of the second pattern region 33b formed on the mask 12 by continuously moving the XY stage 11 in the same manner as the above described procedures. Further, the second detection analog signal SIG1 is converted into a digital signal SIG2 (hereinafter, referred to as second detection digital signal SIG2) by the AD converter 19.

The comparator circuit 21 captures the second detection digital signal SIG2 based on a control signal SIG6 (command) from the calculator 13 and reads out the first detection digital signal SIG2 stored in the inspection signal buffer 22. Then, the comparator circuit 21 carries out comparative check between the first detection digital signal SIG2 and the second detection digital signal SIG2 and detects a difference between the two partial regions 33a and 33b.

As a result, in the case where the difference is detected, the comparator circuit 21 determines that a pattern defect exists, and then, outputs the defect data. On the other hand, in the case where no difference is detected, the comparator circuit 21 determines that no pattern defect exists, and then, outputs data indicating that no defect occurs.

Thereafter, a whole defect inspection of the first pattern region 33a and the second pattern region 33b on the mask 12 is made by repeating a series of steps including a step of moving the XY stage 11 in a stepwise manner by a scan width detected by the image sensor 17 in the direction Y opposite to the continuous movement direction X, and a step of carrying out the above described defect inspection operation.

Next, the XY stage 11 is moved to an inspection start position of the third pattern region 33c on the mask 12. In the same manner as the first pattern region 33a and the second pattern region 33b, defect inspections of the third pattern region 33c and the fourth pattern region 33d on the mask 12 are made.

As shown in FIG. 2B, in the case where first to fourth patterns 34a to 34d (a plurality of pattern regions) on the mask 12 to be inspection objects are not allocated in an arrayed shape, the following inspection is made.

First, the XY stage 11 is moved to the inspection start position of the pattern region 34a to be an inspection reference. Next, in the same manner as the above described procedures, while the XY stage 11 is continuously moved in the X direction, the detection analog signal SIG1 of a unit region that can be detected by the image sensor 17 is converted into a detection digital signal SIG2 by the AD converter 19, and then, the detection digital signal SIG2 is stored in the inspection signal buffer 22.

Then, a detection digital signal SIG2 (hereinafter, referred to as first detection digital signal SIG2) corresponding to the whole pattern region 34a is stored in the detection signal buffer 22 by repeating a series of steps including a step of moving the XY stage 11 in a stepwise manner by a scan width detected by the image sensor 17 in the direction Y opposite to the continuous movement direction X, and a step of additionally storing a detection digital signal SIG2 in the remaining region of the pattern region 34a in the detection signal buffer 22.

Next, the XY stage 11 is moved to the inspection start position of the pattern region 34b. Then, in the same manner as the above described procedures, while the XY stage 11 is continuously moved in the X direction, a detection analog signal SIG1 of a unit region that can be detected by the image sensor 17 is converted into a detection digital signal SIG2 (hereinafter, referred to as second detection digital signal SIG2) by the AD converter 19. Then, the second detection digital signal SIG2 is sent out to the comparator circuit 21. Further, the second detection digital signal SIG2 and the first detection digital signal that is stored in the detection signal buffer 22 are comparatively checked in accordance with the control signal SIG6 (command) from the calculator 13, and the presence or absence of defects in the pattern region 34a and 34b formed on the mask 12 is checked.

Similarly, defect inspections of the first to fourth pattern regions 34a to 34d including the same repetition patterns formed on the mask 12 can be made by checking the presence or absence of the defects in the pattern regions 34a and 34c and by checking the presence or absence of the defects in the pattern regions 34a and 34d.

Then, the defect inspection of the Die-to-Database comparison method described previously is made with respect to a pattern region in which there is no group of the same patterns on the mask 12 other than those on the pattern regions 33a to 33d shown in FIG. 2A and those other than the pattern regions 34a to 34d shown in FIG. 2B, namely, with respect to a pattern region including no repetition pattern. In this manner, a defect inspection of a desired whole region formed on the mask 12 can be made.

Figure 3:
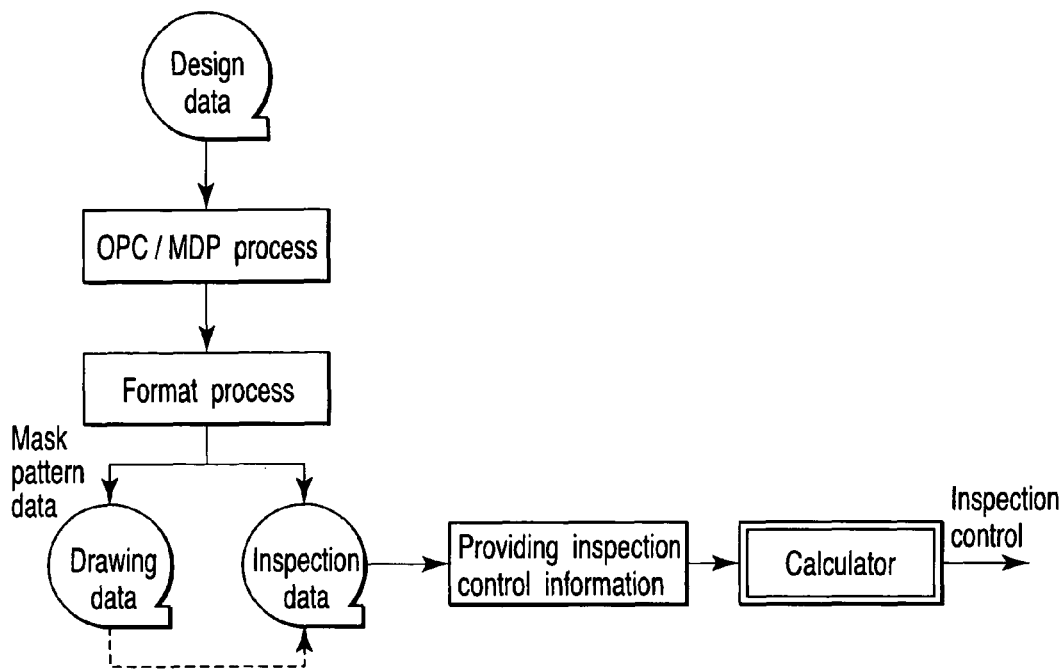
FIG. 3 is a flow chart showing procedures for creating mask pattern data according to the embodiment.

FIG. 3 shows a procedure for creating mask pattern data used in checking the presence or absence of a defect on the mask 12 using the defect inspection apparatus described above.

An optical proximity effect correction called an OPC process is carried out in order to form a desired mask pattern based on design data generated by a pattern design tool (hereinafter, referred to as CAD).

The OPC process is provided as a process for correcting a pattern distortion that occurs at the time of reductively projecting a semiconductor device pattern expressed by the above design data from a mask to a semiconductor wafer by optical exposure means. With the downsizing of semiconductor devices, fine graphics such as fine steps or fine irregularities of a pattern produced by OPC process has been increasingly in progress, and there has been established a situation in which an increasing number of graphics and a concurrently increasing amount of data are rapidly expanded.

In addition, an MDP process and a format process are carried out to convert pattern data expressed by design data into mask pattern data together with the OPC process.

The MDP process is provided as a process for carrying out graphical processing into a desired mask pattern system by graphic computation (such as and/or/xor) of inter-layer data or a resizing process (graphics thinning/thickening process) and a monochrome inversion computation process in order to produce single-layer data which is required in mask pattern data with respect to the pattern data expressed by a combination of plural items of layer data on the design data.

The format process is provided as a process for making data expression in a predetermined rule defined by a drawing device for drawing a desired pattern on a mask based on the above described mask pattern data and by a mask defect inspection apparatus for inspecting pattern validity of a mask having a desired pattern formed thereon.

In this manner, mask pattern data including drawing data and inspection data is created.

The procedures for producing the above mask pattern data are provided as the procedure for producing drawing data and inspection data from design data. The above creating procedure also includes a procedure for creating only drawing data from design data, and then creating inspection data from the drawing data.

Next, a description will be given with respect to inspection control information provided to the mask pattern data created by such a creating procedure. The inspection control information is provided to inspection data contained in mask pattern data.

Figure 4:
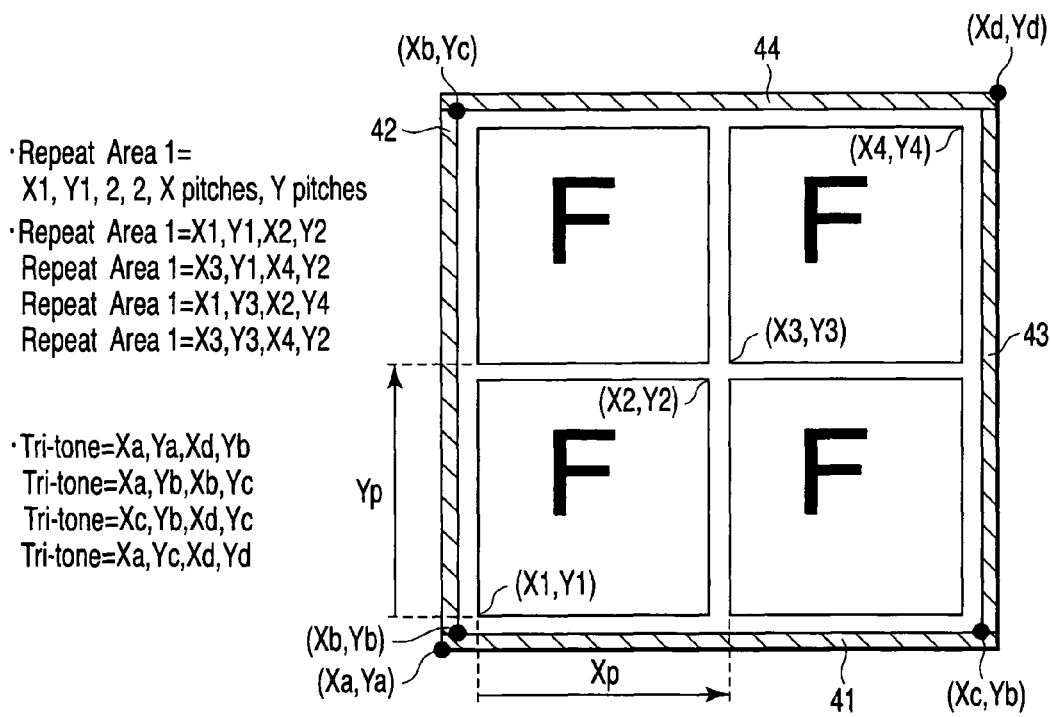
FIG. 4 is a view showing inspection control information provided to the mask pattern data.

FIG. 4 shows inspection control information provided to mask pattern data.

In the figure, Repeat-area 1 describes a pattern region comprising the same repetition patterns.

Repeat-area 1=X1. Y1, 2, 2, Xp, Yp is provided as an expression format for expressing a pattern repetition structure of a unit area F. This format expresses that two pieces of rectangular unit region F defined by coordinate (X1, Y1) are allocated with pitches Xp in the X direction and two pieces of the rectangular unit region F are allocated with pitches Yp in the Y direction.

Another expression format can also be expressed by Repeat-area 1=X1, Y1, X2, Y2 or Repeat-area 1=X3, Y3, X4, Y4. Repeat-area 1=X1, Y1, X2, Y2 expresses a lower left unit region F in accordance with coordinates indicated by two apexes (X1, Y1) and (X2, Y2) formed in a rectangular shape and opposite to each other. Similarly, Repeat-area 1=X3, Y1, X4, Y2 expresses a lower right unit area F; Repeat-area 1=X1, Y3, X2, Y4 expresses an upper left unit area F; and Repeat-area 1=X3, Y3, X4, Y2 expresses an upper right unit area F.

In the above described expression format Repeat-area i (i=1, 2, . . . ), index "i" is provided for identifying a repetition pattern in a pattern region. Pattern areas whose index numbers are identical to each other include the same repetition patterns. Pattern regions whose index numbers are different from each other have different patterns serving as a reference of the repetition patterns.

In FIG. 4, reference numerals 41 to 44 each denote a tri-tone region. The tri-tone regions 41 to 44 each comprise a pattern including at least three or more types of members, i.e., a transparent portion (glass portion) corresponding to a light transmitting portion; a half-tone pattern portion formed of a semitransparent film; and a light shielding film portion formed of a light shielding film for shielding light. The transparent portion (glass portion) is provided as a portion of a glass substrate (transparent substrate) that is not covered with a film such as a light shielding film.

The coordinates of two apexes opposite to each other in the tri-tone regions 41 to 44 are defined as (Xa, Ya) and (Xd, Yd). These two apexes opposite to each other are obtained as coordinates on the outer periphery of the tri-tone regions 41 to 44. The coordinates of the other two apexes opposite to each other in the tri-tone regions 41 to 44 are defined as (Xb, Yc) and (Xc, Yb). The other two apexes opposite to each other are obtained as coordinates on the inner periphery of the tri-tone regions 41 to 44.

By using Xa, Xb, Xc, Xd, Ya, Yb, Yc and Yd, the tri-tone regions 41 to 44 can be described in the expression formats below:

Tri-tone region 41: tri-tone=Xa, Ya, Xd, Yb
Tri-tone region 42: tri-tone=Xa, Yb, Xb, Yc
Tri-tone region 43: tri-tone=Xc, Yb, Xd, Yc
Tri-tone region 44: tri-tone=Xa, Yc, Xd, Yd Next, a description will be given with respect to mask pattern data to which such inspection control information is provided and a mask forming method including the mask inspection step using the mask defect inspection apparatus shown in FIG. 1.

Figure 5:
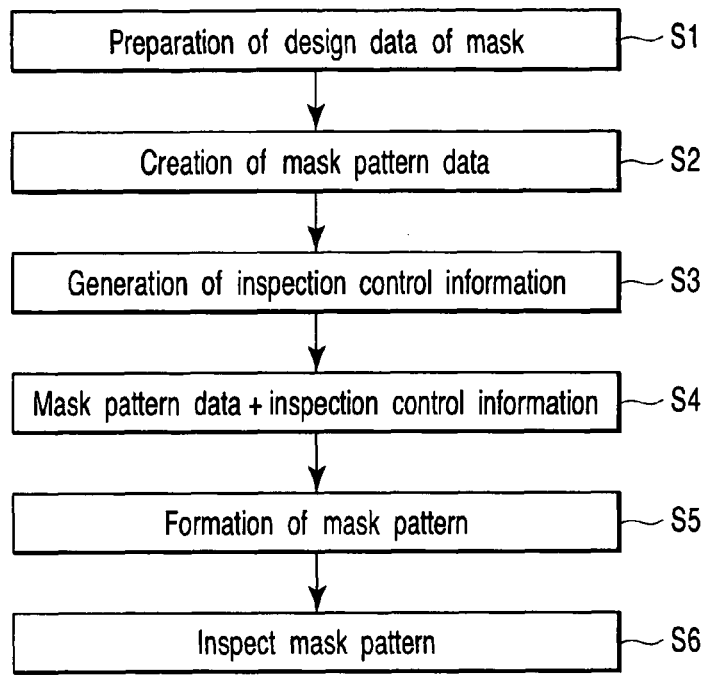
FIG. 5 is a flow chart showing a mask forming method according to the embodiment.

FIG. 5 is a flow chart showing the mask forming method according to the embodiment.

First, design data of a mask is prepared (step S1).

The mask includes a plurality of pattern regions. The plurality of pattern regions each includes the same repetition pattern.

Next, as described in FIG. 3, mask pattern data is created by applying the processing such as the OPC process to design data (step S2).

Next, the above described inspection control information is generated based on the mask pattern data (step S3).

Next, the inspection control information is provided to the mask pattern data (step S4). Hereinafter, the mask pattern data having the inspection control information provided thereto is referred to as drawing/inspection data. As described later, the inspection control information includes positional information of the plurality of pattern regions and inspection sensitivity information of the above described repetition pattern.

Next, based on the drawing/inspection data, a mask pattern including a light shielding pattern and a semitransparent pattern is formed on a transparent substrate such as a glass substrate (step S5).

Next, the above described mask pattern is inspected based on the drawing/inspection data (step S6). A detailed description of step S6 will be given later.

At this time, based on the positional information on the above described plurality of pattern regions, portions corresponding to the repetition patterns in the plurality of pattern regions are selected from the mask pattern. The selected portions are inspected by Die-to-Die comparison method at an inspection sensitivity that corresponds to the above described inspection sensitivity information. The portion in the mask pattern other than the repetition patterns in the plurality of pattern regions is inspected by Die-to-Database comparison method.

The steps of inspecting the mask pattern by Die-to-Die comparison method and the Die-to-Database comparison method are carried out by the same mask defect inspection apparatus. The inspection sensitivity at the time of inspecting the mask pattern by Die-to-Die comparison method is higher than that at the time of inspecting the mask pattern by Die-to-Database comparison method.

As a result of the inspection, a mask having passed the inspection is accepted as a product. On the other hand, a mask having failed the inspection is modified or discarded.

Now, the detailed description will be given with respect to the step of inspecting the pattern based on the above described drawing/inspection data (step S6), namely, the mask inspection method according to the present embodiment.

The mask inspection method according to the present embodiment uses the defect inspection apparatus (mask defect detector device shown in FIG. 1), and mask pattern data. The defect inspection apparatus is capable of mask defect inspection of the Die-to-Die comparison method and the die-to-database comparison method in one system. The mask pattern data has provided thereto inspection control information that includes a pattern region (inspection region) to be inspected by the Die-to-Die comparison method and proper inspection sensitivity (inspection condition) in each pattern region (inspection region). Based on the inspection control information, inspection by Die-to-Die comparison method is made at the proper inspection sensitivity (inspection sensitivity at which a false defect is restricted) with respect to the pattern region including the same repetition pattern, and inspection by die-to-database comparison method is made at the proper inspection sensitivity (inspection sensitivity at which a false defect is restricted) with respect to the other inspection region.

Figure 6:
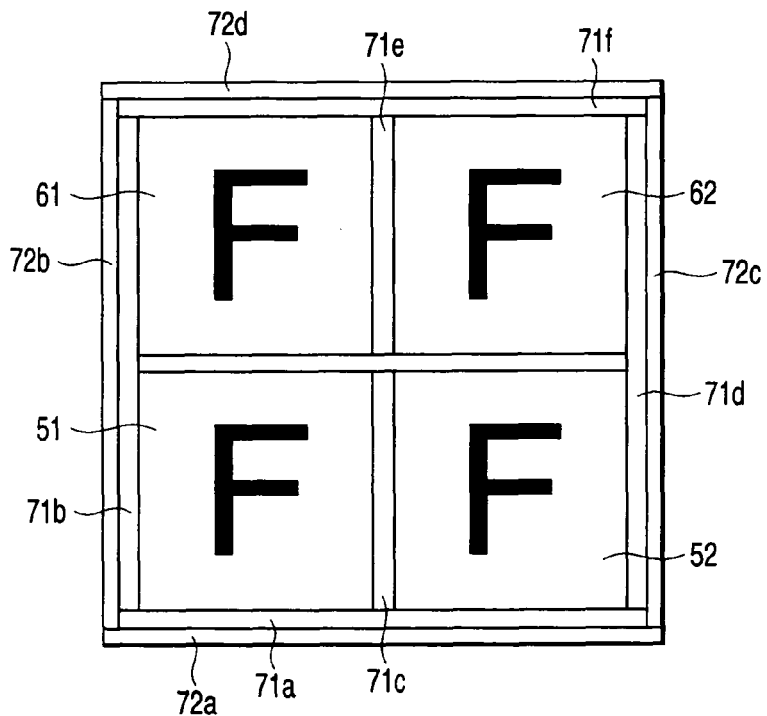
FIG. 6 is a view showing inspection control information provided to the mask pattern data.

The mask of the inspection object includes pattern regions (inspection regions) 51, 52, 61, 62, 71a to 71f, and 72a to 72c shown in FIG. 6.

First, based on the repetition information defined in the Repeat-area "i" described above, the pattern regions 51 and 52 are inspected by Die-to-Die comparison method described previously.

At this time, the set inspection sensitivity is provided as a desired inspection sensitivity determined from a shape of a pattern to be inspected. However, in the case where the inspection sensitivity of the mask defect inspection apparatus does not meet the above desired inspection sensitivity, the inspection regions 51 and 52 are inspected at the maximum sensitivity specific to the mask defect inspection apparatus.

Next, in the same manner as in the case of the pattern regions 51 and 52, the pattern regions 61 and 62 are inspected by Die-to-Die comparison method.

Next, the pattern regions 71a to 71f are inspected by die-to-database comparison method.

At this time, the set inspection sensitivity is provided as a desired inspection sensitivity requiring the severest inspection sensitivity in the group of patterns included for each of the pattern regions 71a to 71f. However, in the case where the inspection sensitivity of the mask defect inspection apparatus does not meet the desired inspection sensitivity, an inspection is made at the maximum sensitivity specific to the mask defect inspection apparatus.

The pattern regions 72a to 72d positioned outside of the pattern regions 71a to 71f are tri-tone regions.

In general, in the tri-tone regions, a gentle inspection sensitivity is often determined from a pattern category included therein, as compared with the pattern regions 51, 52, 61, and 62 that are inspection object of Die-to-Die comparison method and the pattern regions 71a to 71f that are inspection objects of die-to-database comparison method.

Therefore, the inspection regions 72a to 72d are inspected by die-to-database comparison method by normalizing an inspection sensitivity (reducing an inspection sensitivity). In this manner, the detection of false defects on the inspection regions 72a to 72d can be restricted.

In the case of the inspection in a conventional die-to-database comparison method, the desired whole region is inspected at the same inspection sensitivity. Therefore, in the conventional case, there is a possibility that a number of false defects are detected on the inspection regions 72a to 72d when the inspection sensitivity is adjusted to the inspection regions 71a to 71f.

In accordance with such a series of inspection steps, the desired whole pattern formed on the mask can be inspected with the proper inspection sensitivity and the inspection method. As the desired whole pattern can be inspected with the proper inspection sensitivity and the inspection method, a number of false defects can be prevented from being detected on the mask. This makes it possible to reduce review inspection by worker's visual inspection for distinguishing between a false defect and a true defect. As a result, a load for worker and an equipment occupying time are reduced.

Next, a description will be given with respect to a semiconductor device manufacturing method according to the present embodiment.

First, a resist is coated on a substrate including a semiconductor substrate. The semiconductor substrate is, for example, a silicon substrate or an SOI substrate.

Next, a mask obtained by mask forming method of the embodiment is allocated above the substrate, and optical or electric charge beam are irradiated onto the resist via the mask. Thereafter, developing is carried out to form a resist pattern.

Next, the above substrate is etched using the resist pattern as a mask, and a fine pattern is formed.

Here, in the case where an underlying layer of the resist (top layer of the substrate) is made of a poly-silicon film or a metal film, a fine electrode pattern, a wiring pattern or the like is formed. In the case where the underlying layer of the resist (top layer of the substrate) is made of an insulating film, a fine contact hole pattern, a gate insulating film or the like is formed. In the case where the underlying layer of the resist is made of the semiconductor substrate, a fine isolation trench (STI) or the like is formed.

According to the present embodiment, the mask formed by the method that is capable of improving an inspection throughput, a highly integrated/downsized semiconductor device can be easily manufactured within a short period of time.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A mask forming method comprising:
   preparing design data of a mask including a plurality of tri-tone regions and a plurality of pattern regions, the plurality of pattern regions including identical repetition patterns;
   generating mask pattern data of the mask based on the design data;
   generating inspection control information for controlling inspection of a defect on the mask based on the mask pattern data, the inspection control information including information including coordinates of the identical repetition patterns, coordinates of the plurality of tri-tone regions, and inspection sensitivity information of the identical repetition patterns and of the plurality of tri-tone regions;
   generating an item of drawing-inspection data having the mask pattern data and the inspection control information by combining the inspection control information with the mask pattern data, wherein the item of drawing-inspection data is for use in forming and in inspecting a mask pattern of the mask;
   forming the mask pattern of the mask based on the item of drawing-inspection data which is generated before forming the mask pattern; and inspecting the mask pattern based on the item of drawing-inspection data, wherein the inspecting the mask pattern comprises:
  inspecting a first portion in the mask pattern which is different from the plurality of pattern regions by a Die-to-Database comparison method,
  selecting a second portion corresponding to one of the identical repetition patterns in the plurality of pattern regions based on the positional information in the item of drawing-inspection data, and
  inspecting the second portion by a Die-to-Die comparison method at an inspection sensitivity corresponding to the inspection sensitivity information in the item of drawing-inspection data.

2. The method according to claim 1, wherein the inspecting the first portion and the inspecting the second portion are performed by same mask defect inspection apparatus.

3. The method according to claim 2, wherein an inspection sensitivity at the time of inspecting the mask pattern by the Die-to-Die comparison method is higher than an inspection sensitivity at the time of inspecting the mask pattern by the Die-to-Database comparison method.

4. The method according to claim 3, wherein the mask comprises:
  a transparent substrate which transmits light;
  a light shielding pattern which is provided on the transparent substrate and shields the light; and
  a semitransparent pattern which is provided on a region including a portion of the light shielding pattern and transmits part of the light,
  wherein the inspection control information comprises positional information of a region including a laminated structure portion and the inspection sensitivity information, the laminated structure portion comprising the transparent substrate, the light shielding pattern and the semitransparent pattern, the inspection sensitivity information for use in inspecting the laminated structure portion by Die-to-Database comparison method.

5. The method according to claim 2, wherein the mask comprises:
  a transparent substrate which transmits light;
  a light shielding pattern which is provided on the transparent substrate and shields the light; and
  a semitransparent pattern which is provided on a region including a portion of the light shielding pattern and transmits part of the light,
  wherein the inspection control information comprises positional information of a region including a laminated structure portion and the inspection sensitivity information, the laminated structure portion comprising the transparent substrate, the light shielding pattern and the semitransparent pattern, the inspection sensitivity information for use in inspecting the laminated structure portion by the Die-to-Database comparison method.

6. The method according to claim 1, wherein an inspection sensitivity at the time of inspecting the mask pattern by the Die-to-Die comparison method is higher than an inspection sensitivity at the time of inspecting the mask pattern by the Die-to-Database comparison method.

7. The method according to claim 6, wherein the mask comprises:
  a transparent substrate which transmits light;
  a light shielding pattern which is provided on the transparent substrate and shields the light; and
  a semitransparent pattern which is provided on a region including a portion of the light shielding pattern and transmits part of the light,
  wherein the inspection control information comprises positional information of a region including a laminated structure portion and the inspection sensitivity information, the laminated structure portion comprising the transparent substrate, the light shielding pattern and the semitransparent pattern, the inspection sensitivity information for use in inspecting the laminated structure portion by the Die-to-Database comparison method.

8. The method according to claim 1, wherein the mask comprises:
  a transparent substrate which transmits light;
  a light shielding pattern which is provided on the transparent substrate and shields the light; and
  a semitransparent pattern which is provided on a region including a portion of the light shielding pattern and which transmits part of the light,
  wherein the inspection control information includes positional information of a region which includes a laminated structure portion of the transparent substrate, the light shielding pattern and the semitransparent pattern based on the mask pattern data, and inspection sensitivity information for inspecting the laminated structure portion by the Die-to-Database comparison method.

9. The method according to claim 1, wherein the mask pattern data is generated based on the design data in order to correct a pattern distortion that occurs when forming the mask pattern.

10. The method according to claim 1, wherein the mask pattern data is generated based on the design data using an optical proximity effect correction process.

11. A semiconductor device manufacturing method comprising:
  applying a resist on a substrate including a semiconductor substrate;
  forming a resist pattern including disposing a mask formed by a mask forming method, irradiating an optical beam or electric charge beam on the resist via the mask and developing the resist; and
  forming a pattern by etching the substrate using the resist pattern,
  wherein the mask forming method comprises:
    preparing design data of the mask including a plurality of tri-tone regions and a plurality of pattern regions, the plurality of pattern regions including identical repetition patterns;
    generating mask pattern data of the mask based on the design data;
    generating inspection control information for controlling inspection of a defect on the mask based on the mask pattern data, the inspection control information including information regions including coordinates of the identical repetition patterns, coordinates of the plurality of tri-tone regions, and inspection sensitivity information of the identical repetition patterns and of the plurality of tri-tone regions;
    generating an item of drawing-inspection data having the mask pattern data and the inspection control information by combining the inspection control information with the mask pattern data, wherein the item of drawing-inspection data is for use in forming and in inspecting a mask pattern of the mask;
    forming the mask pattern of the mask based on the item of drawing-inspection data which is generated before forming the mask pattern; and
    inspecting the mask pattern based on the item of drawing-inspection data,
    wherein the inspecting the mask pattern comprises:

inspecting a first portion in the mask pattern which is different from the plurality of pattern regions by a Die-to-Database comparison method, selecting a second portion corresponding to one of the identical repetition patterns in the plurality of pattern regions based on the positional information in the item of drawing-inspection data, and inspecting the second portion by a Die-to-Die comparison method at an inspection sensitivity corresponding to the inspection sensitivity information in the item of drawing-inspection data.

12. The method according to claim 11, wherein the inspecting the first portion and the inspecting the second portion are performed by same mask defect inspection apparatus.

13. The method according to claim 12, wherein an inspection sensitivity at the time of inspecting the mask pattern by the Die-to-Die comparison method is higher than an inspection sensitivity at the time of inspecting the mask pattern by the Die-to-Database comparison method.

14. The method according to claim 13, wherein the inspection control information comprises positional information of a region including a laminated structure portion and the inspection sensitivity information, the laminated structure portion comprising a transparent substrate, a light shielding pattern, and a semitransparent pattern, the inspection sensitivity information for use in inspecting the laminated structure portion by the Die-to-Database comparison method.

15. The method according to claim 12, wherein the inspection control information comprises positional information of a region including a laminated structure portion, and the inspection sensitivity information, the laminated structure portion comprising a transparent substrate, a light shielding pattern, and a semitransparent pattern, the inspection sensitivity information for use in inspecting the laminated structure portion by the Die-to-Database comparison method.

16. The method according to claim 11, wherein an inspection sensitivity at the time of inspecting the mask pattern by the Die-to-Die comparison method is higher than an inspection sensitivity at the time of inspecting the mask pattern by the Die-to-Database comparison method.

17. The method according to claim 16, wherein the inspection control information comprises positional information of a region including a laminated structure portion and the inspection sensitivity information, the laminated structure portion comprising a transparent substrate, a light shielding pattern, and a semitransparent pattern, and the inspection sensitivity information for use in inspecting the laminated structure portion by the Die-to-Database comparison method.

18. The method according to claim 11, wherein the mask comprises:

a transparent substrate which transmits light;

a light shielding pattern which is provided on the transparent substrate and shields the light; and a semitransparent pattern which is provided on a region including a portion of the light shielding pattern and which transmits part of the light, wherein the inspection control information comprises positional information of a region including a laminated structure portion and the inspection sensitivity information, the laminated structure portion comprising the transparent substrate, the light shielding pattern and the semitransparent pattern, the inspection sensitivity information for use in inspecting the laminated structure portion by Die-to-Database comparison method.

19. The method according to claim 11, wherein the mask pattern data is generated based on the design data in order to correct a pattern distortion that occurs when forming the mask pattern.

20. The method according to claim 11, wherein the mask pattern data is generated based on the design data using an optical proximity effect correction process.

* * * * *

UNITED STATES PATENT AND TRADEMARK OFFICE
CERTIFICATE OF CORRECTION

| | | |
|---|---|---|
| PATENT NO. | : 8,036,446 B2 | |
| APPLICATION NO. | : 11/439989 | |
| DATED | : October 11, 2011 | |
| INVENTOR(S) | : Ikenaga et al. | |

It is certified that error appears in the above-identified patent and that said Letters Patent is hereby corrected as shown below:

Claim 11, column 12, line 51, change "information regions" to --information--.

Signed and Sealed this
Sixth Day of March, 2012

David J. Kappos
*Director of the United States Patent and Trademark Office*